United States Patent
Tak et al.

(10) Patent No.: US 8,179,736 B2
(45) Date of Patent: May 15, 2012

(54) ANTIFUSES AND PROGRAM CIRCUITS HAVING THE SAME

(75) Inventors: Nam-Kyun Tak, Bucheon-si (KR); Ki-Whan Song, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 211 days.

(21) Appl. No.: 12/654,282

(22) Filed: Dec. 16, 2009

(65) Prior Publication Data

US 2010/0149898 A1 Jun. 17, 2010

(30) Foreign Application Priority Data

Dec. 17, 2008 (KR) .................. 10-2008-0128771

(51) Int. Cl.
*G11C 17/18* (2006.01)
(52) U.S. Cl. .......... 365/225.7; 365/203; 365/154; 365/174
(58) Field of Classification Search ........... 365/225.7, 365/174, 181, 184, 185.27, 154, 203
See application file for complete search history.

(56) References Cited

U.S. PATENT DOCUMENTS

2006/0002187 A1* 1/2006 Forbes .................. 365/185.01

FOREIGN PATENT DOCUMENTS

| KR | 10-2002-0070099 | 9/2002 |
| KR | 10-2003-0082939 | 10/2003 |
| KR | 10-2006-0087600 | 8/2006 |

OTHER PUBLICATIONS

David Esseni et al., "Injection Efficiency of CHISEL Gate Currents in Short MOS Devices: Physical Mechanisms, Device Implications, and Sensitivy to Technological Parameters" IEEE Transactions on Electron Devices, vol. 47, No. 11, Nov. 2000.

* cited by examiner

*Primary Examiner* — Thong Q Le
(74) *Attorney, Agent, or Firm* — Harness Dickey & Pierce, P.L.C.

(57) ABSTRACT

Antifuses and program circuits having the same. The antifuses are embodied as a transistor. When a first power supply voltage is applied to a source, a first program voltage for causing impact ionization is applied to a gate and drain, and a second program voltage for causing channel initiated secondary electron/channel initiated secondary hole (CHISEL/CHISHL) is applied to a well, a dielectric material may be ruptured between the gate adjacent to the drain and the well so that an antifuse may be programmed.

19 Claims, 4 Drawing Sheets

ANTIFUSES AND PROGRAM CIRCUITS HAVING THE SAME

PRIORITY STATEMENT

This application claims priority under 35 U.S.C. §119 to Korean Patent Application No. 10-2008-0128771, filed on Dec. 17, 2008, in the Korean Intellectual Property Office (KIPO), the entire contents of which is incorporated herein by reference.

BACKGROUND

1. Field

Example embodiments relate to antifuses and program circuits having the same, and more particularly to transistor-dielectric-rupture-type antifuses using channel initiated secondary electron/channel initiated secondary hole (CHISEL/CHISHL) programming and a program circuit having the same.

2. Description of Related Art

An antifuse is a programmable resistive fuse device that may have opposite electrical properties to those of a typical fuse device. For example, where a fuse device will sever an electrical connection upon the receiving of a sufficient current (e.g., open-circuit), the antifuse device will establish an electrical connection upon the receiving of a sufficient current (e.g., short-circuit). A state in which the antifuse device does not permit the flow of electricity is known as the "unprogrammed" state while the state in which the antifuse device permits the flow of electricity is known as the "programmed" state. Specifically, the antifuse may have a high resistance of, for example, about 100 MΩ in an unprogrammed state and have a low resistance of, for example, about 100 KΩ or lower in a programmed state.

In general, an antifuse may include conductive materials between which a dielectric material is interposed. A program operation of the antifuse may involve applying a high program voltage of, for example, about 10 V to the conductive materials corresponding to both terminals of the antifuse for an amount of time sufficient to rupture the dielectric material interposed between the conductive materials. As a result, when the antifuse is programmed, an electrical short may occur between the conductive materials corresponding to both the terminals of the antifuse, thereby reducing the resistance of the antifuse. A program circuit may be capable of programming an antifuse during a program operation and determining whether the antifuse is programmed or not during a normal operation.

Presently, it is necessary to develop techniques of easily embodying and integrating an antifuse, and increasing the reliability of a program operation of the antifuse. The reliability of the program operation is related to a program voltage. Specifically, an antifuse should not be programmed during application of a lower voltage than a program voltage, and should be reliably programmed during application of a higher voltage than the program voltage.

SUMMARY

Example embodiments provide an antifuse that can be easily embodied and enables a reliable and/or improved program operation. Example embodiments also provide a program circuit having the antifuse.

According to example embodiments, an antifuse may include a substrate of a first conductivity type; a source; a drain of a second conductivity type in a region of the substrate; a gate on the substrate between the source and drain; a dielectric layer between the gate and substrate, the dielectric configured to rupture upon application of a first program voltage to the substrate, a second program voltage to the gate and drain, and a first power supply to the source.

According to example embodiments, the second program voltage for may be an impact ionization programming voltage and the first program voltage may be one of a channel initiated secondary electron (CHISEL) programming voltage and a channel initiated secondary hole (CHISHL) programming voltage. The antifuse may be configured to rupture the dielectric material is ruptured in a region adjacent to the drain and the gate.

The antifuse may be an n-type metal oxide semiconductor (NMOS) transistor, which may receive a positive voltage as the second program voltage, a negative voltage as the first program voltage, and a ground voltage as the first power supply voltage and generate CHISEL. The antifuse may be a p-type metal oxide semiconductor (PMOS) transistor, which may receive a negative voltage as the second program voltage, a positive voltage as the first program voltage, and a ground voltage as the first power supply voltage and generate CHISHL.

According to example embodiments, a program circuit includes a program/precharge unit configured to precharge a first node in response to a power stabilization signal during an initialization operation, the program/precharge unit configured to receive first and second program voltages, the program/precharge unit configured to program an antifuse in response to a program mode signal and an address signal during a program operation, and the program/precharge unit configured to determine a voltage level of a voltage of the first node; and a latch unit configured to latch and invert the voltage level of the voltage of the first node and output an inverted voltage to an output node. The antifuse may include a transistor in a well in a region of a substrate. The transistor may include a source, drain, dielectric material and gate, the gate connected to the first node. In the transistor, when a first power supply voltage is applied to a source, the first program voltage for causing impact ionization is applied to a drain and a gate connected to the first node, and the second program voltage for causing CHISEL/CHISHL is applied to the well connected to a pad, a dielectric material interposed between the gate and the well adjacent to the drain is ruptured and/or creates a short-circuit.

The program/precharge unit may include the antifuse configured to be programmed in response to the first and second program voltages; a NAND gate configured to perform a logic NAND on the program mode signal and the address signal and output an output signal; a first PMOS transistor connected to the first program voltage and the drain of the antifuse and configured to receive the output signal of the NAND gate; a second PMOS transistor connected between the first program voltage and the first node and configured to receive the output signal of the NAND gate; a third PMOS transistor connected between a second power supply voltage and the first node and having a gate to which the power stabilization signal is applied; and the pad configured to apply the second program voltage to the well during the program operation.

According to example embodiments, a semiconductor device may include a substrate of a first conductivity type, a source and drain of a second conductivity type disposed apart from each other in a region of the substrate, a gate on the substrate between the source and drain, a dielectric layer between the gate and substrate, and a control circuit configured to apply a first program voltage to the substrate, a second program voltage to the gate and drain, and a first power supply voltage to the source, such that the dielectric layer ruptures.

BRIEF DESCRIPTION OF THE DRAWINGS

Example embodiments will be more clearly understood from the following brief description taken in conjunction with the accompanying drawings.

FIG. 1 is a cross-sectional diagram of an antifuse according to example embodiments;

FIG. 2 is a cross-sectional diagram of an antifuse according to example embodiments;

FIG. 3 is a circuit diagram of a program circuit having an antifuse according to example embodiments;

FIG. 4 is a timing diagram illustrating operation of the program circuit of FIG. 3; and FIG. 5 is a circuit diagram of a program circuit having an antifuse according to example embodiments.

Figure 1:
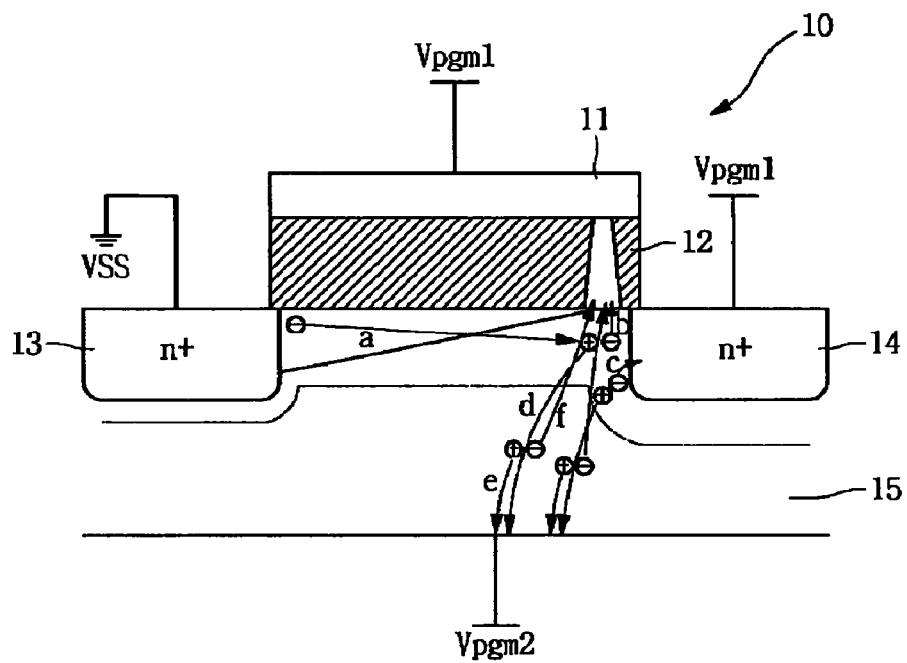
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of an antifuse embodied as a single transistor according to example embodiments. Referring to FIG. 1, an antifuse 10 may be a typical n-type metal oxide semiconductor (NMOS) thin film transistor (TFT), which may include a p-type substrate region 15, an n-type source 13 and an n-type drain 14 disposed apart from each other in the substrate region 15. The antifuse 10 may include a dielectric material 12 disposed on the substrate region 15 between the source 13 and the drain 14, and a gate 11 disposed on the dielectric material 12.

The antifuse 10 of FIG. 1 may be programmed using channel initiated secondary electron/channel initiated secondary hole (CHISEL/CHISHL) programming. A program operation of the antifuse 10 of FIG. 1 will now be described. A ground voltage VSS may be always applied to the source 13 irrespective of a program operation. A first program voltage Vpgm1 may be applied to the gate 11 and the drain 14 during a program operation. A second program voltage Vpgm2 may be applied to the substrate region 15 of the NMOS transistor 10. The second program voltage Vpgm2 may be applied, for example, after the first program voltage Vpgm1 is applied to the gate 11 and the drain 14. The first program voltage Vpgm1 may be a positive voltage (e.g., about 3.5 V) and the second program voltage Vpgm2 may be a negative voltage (e.g., about −3.5 V).

When the ground voltage VSS is applied to the source 13 and the first program voltage Vpgm1 is applied to the gate 11 and the drain 14, electrons may be emitted from the source 13 to the drain 14 (e.g., according to "a"). While moving from the source 13 to the drain 14, the electrons may be accelerated to generate primary electron-hole pairs in a depletion area adjacent to the drain 14 due to impact ionization. Some primary electrons generated due to the impact ionization may collide with the dielectric material 12 disposed under the gate 11 in response to the first program voltage Vpgm1 applied to the gate 11 (e.g., according to "b"), while the other primary electrons may be absorbed by the drain 14 (e.g., according to "c").

Primary holes generated due to the impact ionization may be accelerated and moved from the depletion area into the substrate region 15 in response to the first and second program voltages Vpgm1 and Vpgm2 (e.g., according to "d"). Secondary electron-hole pairs may be generated in the substrate 15 due to the accelerated primary holes. Secondary holes may be combined with electrons generated due to the second program voltage Vpgm2 applied to the substrate region 15 (e.g., according to "e"). Secondary electrons generated in the substrate region 15 due to CHISEL may be accelerated towards the gate 11 in response to the first and second program voltages Vpgm1 and Vpgm2. The secondary electrons may collide with the dielectric material 12 adjacent to the drain 14. The dielectric material 12 may be ruptured as a result of the collisions (e.g., according to "f"). Since the rupture of the dielectric material 12 may lead to a short circuit between the gate 11 and the substrate region 15, the antifuse 10 may be programmed.

As described above, the antifuse 10 according to example embodiments may be programmed on a principle that secondary electrons generated in the substrate region 15 are accelerated and rupture the dielectric material 12 adjacent to the drain 14. A voltage difference between the first and second program voltages Vpgm1 and Vpgm2 may be high enough to cause CHISEL, and for secondary electrons generated due to the CHISEL to rupture the dielectric material 12. Because the secondary electrons are accelerated, collide with the dielectric material 12 and rupture the dielectric material 12, the antifuse 10 according to the example embodiments may be programmed using a lower program voltage than a conventional antifuse.

A voltage level of the voltage at which the antifuse 10 is programmed may have a low dispersion because the secondary electrons concentratively collide with a region of the dielectric material 12 adjacent to the drain 14. Because the voltage level at which the antifuse 10 is programmed has a very low dispersion, it may be unnecessary to boost the program voltage. Therefore, it may be reliably determined whether the antifuse 10 is programmed or not based on the program voltage.

When the antifuse 10 is not intended to be programmed during the program operation, the first program voltage Vpgm1 may not be applied to the gate 11 and the drain 14.

The first and second program voltage Vpgm1 and Vpgm2 may vary according to, for example, the material and thickness of the dielectric material 12, and the channel length and channel width of the transistor 10. The first and second program voltage Vpgm1 and Vpgm2 may be obtained empirically. When the antifuse 10 is not programmed, a voltage level of the second program voltage Vpgm2 may be determined so that a high reverse bias voltage is not applied.

According to example embodiments, the antifuse 10 may be embodied as an NMOS transistor or a PMOS transistor. When the antifuse 10 is embodied as a PMOS transistor, the first and second program voltages Vpgm1 and Vpgm2 may have opposite polarities from that of an antifuse 10 embodied as an NMOS transistor. Because the dielectric material is ruptured by secondary holes, the antifuse 10 may be programmed due to CHISHL.

FIG. 1 illustrates an antifuse 10 including a substrate region 15. Because the second program voltage Vpgm2 may be applied to the substrate region 15 during the programming of the antifuse 10, when the antifuse 10 includes the substrate region 15, other circuits in the substrate (not shown) may be affected by the second program voltage Vpgm2. When other circuits are in the substrate, a pocket well may be included in the substrate and the antifuse 10 may include the pocket well.

Figure 2:
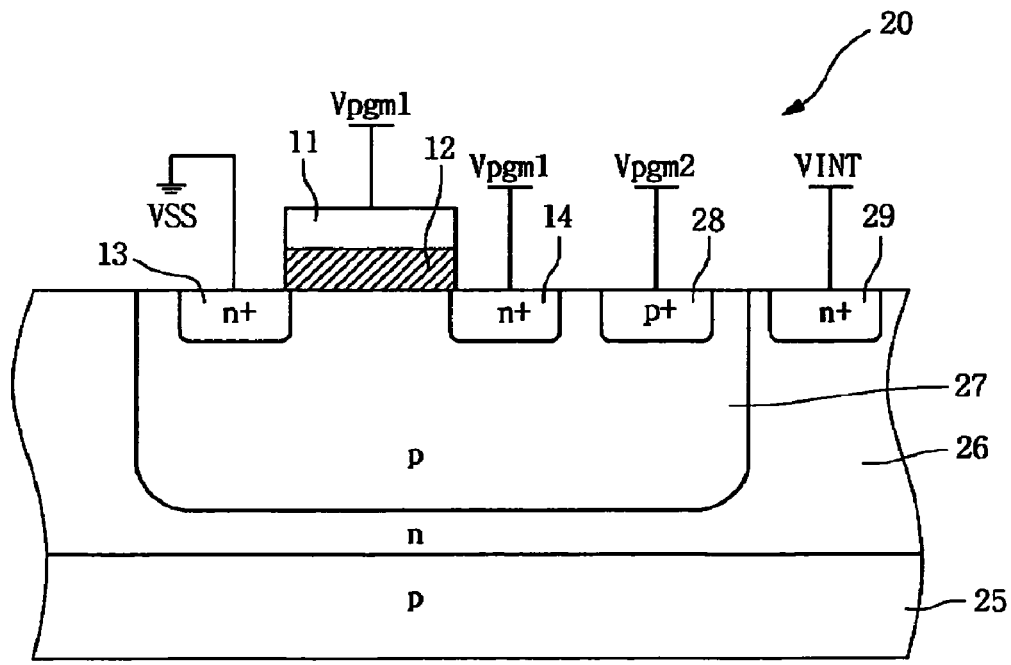

FIG. 2 is a cross-sectional diagram of an antifuse according to example embodiments including a pocket well. Referring to FIG. 2, an n-type well 26 may be in a substrate 25, a p-type pocket well 27 may be in the n-type well 26, and an antifuse 20 may include the pocket well 27. Other circuits (not shown) in the substrate 25 including the antifuse 20 may not be affected by a second program voltage Vpgm2. A well electrode 28 may be in the pocket well 27 for application of the second program voltage Vpgm2 through the pocket well 27. An internal power supply voltage VINT may be applied through a well electrode 29 to the n-type well 26. Although FIG. 2 illustrates application of the internal power supply voltage VINT to the n-type well 26, according to example embodiments a boost voltage or another positive voltage may be applied instead. Because the antifuse 20 of FIG. 2 operates in the same manner as the antifuse 10 of FIG. 1 except that the antifuse 20 is formed in the pocket well 27, a detailed description thereof will be omitted.

Figure 3:
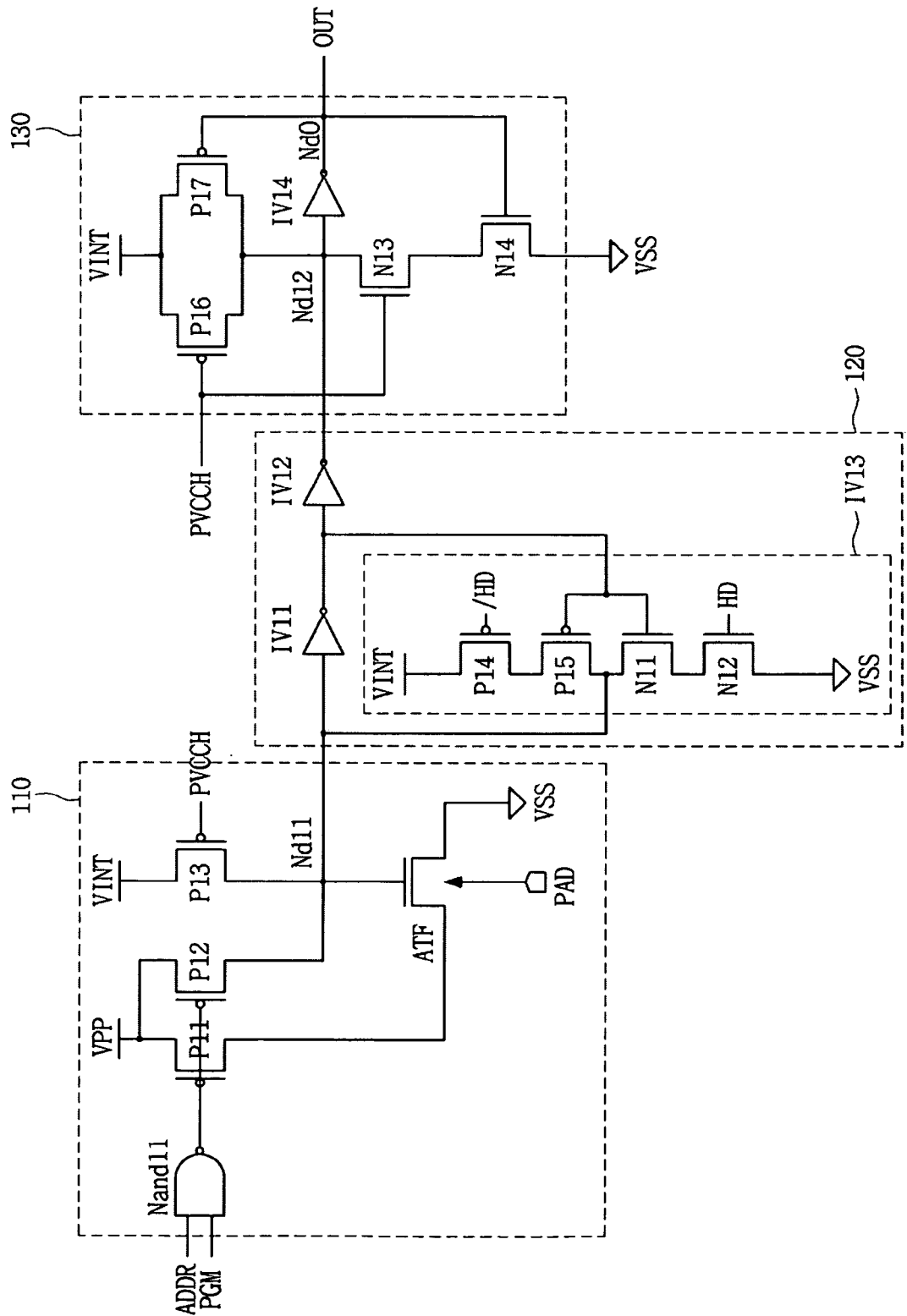

FIG. 3 is a circuit diagram of a program circuit including an antifuse according to example embodiments. In FIG. 3, a program circuit may include a program/precharge unit 110 and a latch unit. The program/precharge unit 110 may program an antifuse ATF during a program operation and precharge a first node Nd11 to the level of a power supply voltage VINT at the early stage of power application irrespective of a program operation or a non-program operation. The latch unit may include a first latch unit 120 and a second latch unit 130. The first latch unit 120 may latch and buffer the voltage level of the voltage of the first node Nd11 and output a resultant voltage to a second node Nd12. The second latch unit 130 may precharge the second node Nd12 to the level of the power supply voltage VINT in a normal operation, latch and invert the output voltage of the first latch unit 120, and output an output signal OUT.

The program/precharge unit 110 may include the antifuse ATF, a NAND gate Nand11, and three PMOS transistors P11, P12 and P13. The NAND gate Nand11 may perform a NAND operation on a program mode signal PGM and an address signal ADDR, and output a logic NAND signal to gates of the two PMOS transistors P11 and P12. The program mode signal PGM may indicate whether or not the program circuit is in the program operation and the address signal ADDR may select the antifuse ATF to be programmed. The address signal ADDR may be enabled when the antifuse ATF of the program circuit is to be programmed. First terminals of the two PMOS transistors P11 and P12 may be connected to a boost voltage VPP (e.g., Vpgm1 of FIGS. 1 and/or 2), which is a first program voltage for programming the antifuse ATF. Second terminals of the two PMOS transistors P11 and P12 may be connected to a drain of the antifuse ATF and the first node Nd11, respectively. The PMOS transistor P13 may be connected between the power supply voltage VINT and the first node Nd11. The PMOS transistor P13 may have a gate to which a power stabilization signal PVCCH may be applied. The antifuse ATF may be connected between the PMOS transistor P11 and a ground voltage VSS. The antifuse ATF may have a gate connected to the first node Nd11 and a well electrode connected to a pad PAD. The power stabilization signal PVCCH may be maintained at a low level with a rise in the power supply voltage VINT at an early stage in which the power supply voltage VINT is applied to a device including the program circuit, and may rise to a high level when the power supply voltage VINT reaches a specific level and is maintained at the level.

The first latch unit 120 may include three inverters IV11, IV12 and IV13. The two inverters IV11 and IV12 may be connected in series between the first and second nodes Nd11 and Nd12. The inverter IV13 may invert an output signal of the inverter IV11 in response to a hold signal HD and an inverted hold signal /HD, and apply the inverted signal to the first node Nd11. The inverter IV13 may include two PMOS transistors P14 and P15 and two NMOS transistors N11 and N12, which are connected in series between the power supply voltage VINT and the ground voltage VSS. The hold signal HD and the inverted hold signal /HD may be applied to gates of the NMOS transistor N12 and the PMOS transistor P14, respectively. The output signal of the inverter IV11 may be applied to gates of the NMOS transistor N11 and the PMOS transistor P15. The inverter IV12 may be highly drivable and may have sufficiently high drivability to shift a level of a signal that is being latched by the second latch unit 130.

The second latch unit 130 may include an inverter IV14, two PMOS transistors P16 and P17, and two NMOS transistors N13 and N14. The inverter IV14 may be connected between the second node Nd12 and an output node NdO. The two PMOS transistors P16 and P17 may be connected in parallel between the power supply voltage VINT and the second node Nd12. The two NMOS transistors N13 and N14 may be connected in series between the second node Nd12 and the ground voltage VSS. The power stabilization signal PVCCH may be applied to gates of the PMOS transistor P16 and the NMOS transistor N13, while gates of the PMOS transistor P17 and the NMOS transistor N14 may be connected to the output node NdO.

Figure 4:
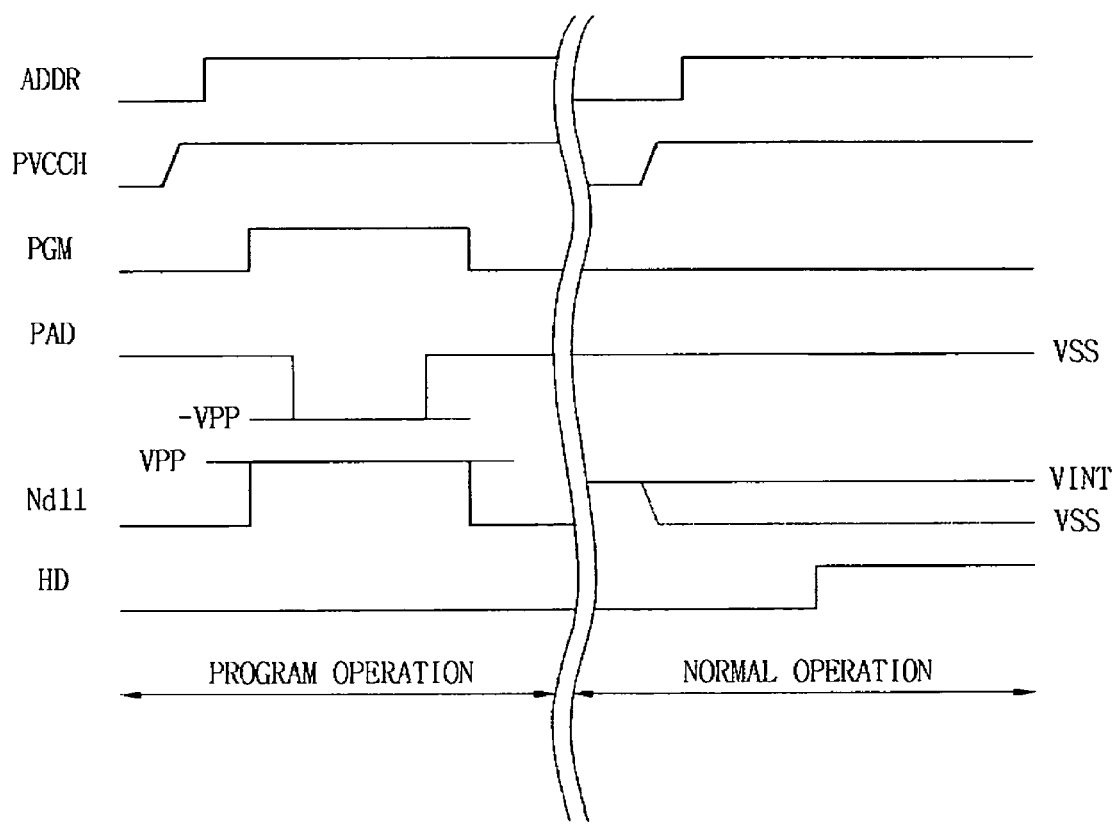

FIG. 4 is a timing diagram illustrating operation of the program circuit of FIG. 3. A program operation of the program circuit of FIG. 3 will now be described with reference to FIGS. 2-4. Initially, the power stabilization signal PVCCH is at a low level at the early stage of power application and the PMOS transistors P13 and P16 may be turned on. The PMOS transistors P13 and P16 may precharge the first and second nodes Nd11 and Nd12 to the level of the power supply voltage VINT. Although the NMOS transistor N13 may also be turned on in response to the power stabilization signal PVCCH, because the output node NdO is at a low level, the NMOS transistor N14 may remain turned off. As a result, the voltage of the second node Nd12 may be maintained at the level of the power supply voltage VINT. When the power stabilization signal PVCCH rises to a high level, the PMOS transistors P13 and P16 and the NMOS transistor N13 may be turned off.

The program mode signal PGM may be enabled during the program operation. When the antifuse ATF of the program circuit is to be programmed, the address signal ADDR may be enabled. According to one or more embodiments, an enabled signal is a logic high level. A NAND gate Nand11 may output a low-level signal, and the PMOS transistors P11 and P12 may be turned on. The boost voltage VPP may be applied to a gate and drain of the antifuse ATF. The boost voltage VPP (e.g., Vpgm1 of FIGS. 1, 2 and/or 3) may have a higher voltage level than the power supply voltage VINT. The second program voltage (e.g., Vpgm2 of FIGS. 1, 2 and/or 3) may be applied through the pad PAD of the antifuse ATF to the pocket well 27. In FIG. 3, the second program voltage Vpgm2 may have a negative boost voltage (−VPP) level. Because a source of the antifuse ATF may be always connected to the ground voltage VSS, a dielectric material 12 may be ruptured under the same condition as in the program operation of the antifuse 20 described with reference to FIG. 2 so that the antifuse 20 may be programmed.

The inverter IV may output a low-level signal in response to the boost voltage VPP applied to the first node Nd11. The inverter IV13 may remain turned off in response to disabled hold and inverted hold signals HD and /HD and the output signal of the inverter IV11.

When the antifuse 20 is not to be programmed during the program operation, a low-level address signal ADDR is applied so that the NAND gate Nand11 may output a high-level signal, and the PMOS transistors P11 and P12 may be turned off. The first node Nd11 may be maintained at the level of the precharged power supply voltage VINT and the antifuse ATF may not be programmed. During a normal operation, the first and second nodes Nd11 and Nd12 may be precharged to the level of the power supply voltage VINT at the early stage of power application. Because the program mode signal PGM is disabled, the PMOS transistors P11 and P12 may be turned off irrespective of the address signal ADDR. When the antifuse ATF is not programmed, the first node Nd11 may be maintained at the level of the power supply voltage VINT. The first latch unit 120 may output a high-level signal to the second node Nd12 in response to the voltage of the first node Nd11. When the hold signal HD and the inverted hold signal /HD are enabled, the inverter IV13 may invert the output signal of the inverter IV11, output the inverted signal to the first node Nd11, and maintain the first node Nd11 at the level of the power supply voltage VINT. The second latch unit 130 may invert and latch a signal of the inverter IV12 and output a low-level output signal.

When the antifuse ATF is programmed, a leakage current may flow from the gate through the dielectric material 12 to the source 13 and the well 26. The voltage of the first node Nd11 may drop. The first latch unit 120 may output a low-level signal to the second node Nd12. When the hold signal HD and the inverted hold signal /HD are enabled, the inverter IV13 may invert the output of the inverter IV11, output the inverted output to the first node Nd11, and drop the voltage of the first node Nd11 to the level of the ground voltage VSS. In this case, the inverter IV13 may prevent generation of a leakage current in the inverter IV11 while the voltage of the first node Nd11 is not completely dropped to a low level and has a voltage of, for example, about 0.3 V.

Although the second node Nd12 is latched at a high level by the second latch unit 130, because the inverter IV12 having a high drivability outputs a low-level signal, the second latch unit 130 may output a high-level output signal. It may be determined whether the antifuse ATF is programmed or not depending on whether a high-level output signal or low-level output signal is output during the normal operation.

Figure 5:
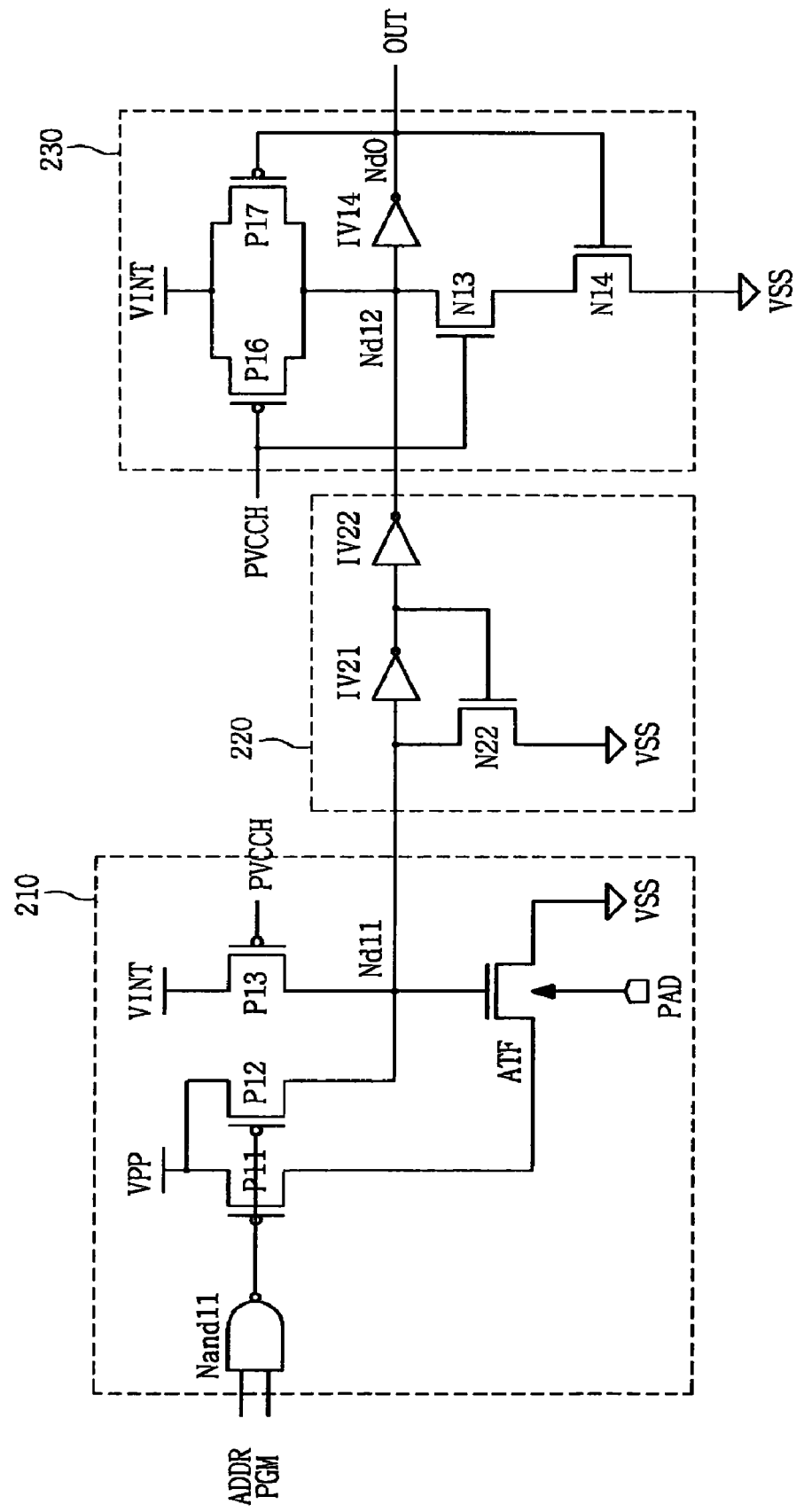

FIG. 5 is a diagram of a program circuit including an antifuse according to example embodiments. Since a program/precharge unit 210 and a second latch unit 230 of the program circuit of FIG. 5 may be the same as the program/precharge unit 110 and the second latch unit 130 of the program circuit of FIG. 3, a description thereof will not be reiterated. In FIG. 5, a first latch unit 220 may include two inverters IV21 and IV22 and a single NMOS transistor N22 unlike the first latch unit 120 of FIG. 3. The inverter IV13 of FIG. 3 may be replaced by at least one NMOS transistor N22. Because operation of the program circuit of FIG. 5 is the same as illustrated in FIG. 4 except for the hold signal HD, it will be easily understood by those of skilled in the art. Although FIGS. 3 and 5 illustrate the antifuse embodied as an NMOS transistor, the antifuse may be embodied as a PMOS transistor and the constitution of the program circuit may be changed accordingly.

One having ordinary skill in the art will understand that the antifuses and program circuits described in example embodiments may be embodied in many different forms. For example, the antifuse may be separate from a program circuit or part of the program circuit. The antifuse may be programmed by a general control circuit that performs several functions and/or a dedicated program circuit. The antifuse may be part of a logic programmable semiconductor device and/or an electrostatic discharge (ESD) circuit. The program circuit may program a plurality of antifuses.

An antifuse according to example embodiments can be embodied as a transistor. A program circuit may program the antifuse. A dielectric material adjacent to a drain of the transistor may be concentratively ruptured using CHISEL/CHISHL so that the antifuse can be programmed with high reliability at a low program voltage.

While example embodiments have been particularly shown and described, it will be understood by one of ordinary skill in the art that variations in form and detail may be made therein without departing from the spirit and scope of the claims.

What is claimed is:

1. An antifuse, comprising:
 a substrate of a first conductivity type;
 a source and drain of a second conductivity type disposed apart from each other in a region of the substrate;
 a gate on the substrate between the source and drain; and
 a dielectric layer between the gate and substrate, the dielectric layer configured to rupture upon application of a first program voltage to the substrate, a second program voltage to the gate and drain, and a first power supply voltage to the source.

2. The antifuse of claim 1, wherein the first program voltage is one of a channel initiated secondary electron (CHISEL) programming voltage and a channel initiated secondary hole (CHISHL) programming voltage,
 the second program voltage is an impact ionization programming voltage, and
 the dielectric layer is configured to rupture at a region adjacent to the drain.

3. The antifuse of claim 2, wherein the antifuse is an n-type metal oxide semiconductor (NMOS) transistor configured to receive a negative voltage as the first program voltage, a positive voltage as the second program voltage, and a ground voltage as the first power supply voltage, and
 the first program voltage is the CHISEL programming voltage.

4. The antifuse of claim 2, wherein the antifuse is a p-type metal oxide semiconductor (PMOS) transistor configured to receive a positive voltage as the first program voltage, a negative voltage as the second program voltage, and a ground voltage as the first power supply voltage, and
 the first program voltage is the CHISHL programming voltage.

5. The antifuse of claim 3, wherein the first program voltage is about −3.5 V and the second program voltage is about 3.5 V.

6. The antifuse of claim 2, further comprising:
 a well of the second conductivity type in the substrate; and
 a pocket type well of the first conductivity type in the well, wherein the region of the substrate is in the pocket type well.

7. The antifuse of claim 6, further comprising:
 a pocket type well region of the first conductivity type in the pocket type well, separated from the source and drain, and configured to receive the first program voltage;
 a well region of the second conductivity type in the well, the well region separated from the pocket type well, and configured to receive an internal power supply voltage.

8. A program circuit, comprising:
 a program/precharge unit configured to precharge a first node in response to a power stabilization signal during an initialization operation, the program/precharge unit configured to program an antifuse in response to a program mode signal and an address signal during a program operation, the program/precharge unit configured to receive first and second program voltages, and the program/precharge unit configured to determine a voltage of the first node; and
 a latch unit configured to latch and invert the voltage of the first node and output an inverted voltage to an output node,
 wherein the antifuse includes a transistor in a well in a region of a substrate, the well connected to a pad,
 the transistor includes a source, drain, dielectric material and gate, the gate connected to the first node,
 the first program voltage is an impact ionization programming voltage,
 the second program voltage is a channel initiated secondary electron/channel initiated secondary hole (CHISEL/CHISHL) program voltage, and
 the dielectric material between the gate and the well adjacent to the drain is configured to rupture upon application of a first power supply voltage to the source, the first program voltage to the drain and the gate, and the second program voltage to the well.

9. The program circuit of claim 8, wherein the program/precharge unit comprises:
 the antifuse configured to be programmed by the first and second program voltages;
 a NAND gate configured to perform a logic NAND on the program mode signal and the address signal, and output an output signal;

a first p-type metal oxide semiconductor (PMOS) transistor connected to the first program voltage and the drain of the antifuse, and configured to receive the output signal of the NAND gate;
a second PMOS transistor connected between the first program voltage and the first node and configured to receive the output signal of the NAND gate;
a third PMOS transistor connected between a second power supply voltage and the first node and having a gate to which the power stabilization signal is applied; and
the pad configured to apply the second program voltage to the well during the program operation.

10. The program circuit of claim 9, wherein the antifuse is an n-type metal oxide semiconductor (NMOS) transistor,
the first power supply voltage is a ground voltage,
the first program voltage is a positive boost voltage having a higher voltage level than the second power supply voltage,
and the second program voltage is a negative boost voltage having a voltage level whose absolute value is higher than the second power supply voltage.

11. The program circuit of claim 8, wherein the latch unit comprises:
a first latch unit configured to latch the voltage of the first node and output the latched voltage to a second node; and
a second latch unit configured to precharge the second node in response to the power stabilization signal, latch and invert a voltage of the second node, and output an output signal to an output node.

12. The program circuit of claim 11, wherein the first latch unit comprises:
a first inverter configured to invert the voltage of the first node and output a first inverted voltage;
a second inverter configured to invert the first inverted voltage and output a second inverted voltage to the second node, the second inverter having a sufficiently high drivability to shift the voltage of the second node that is latched by the second latch unit; and
a third inverter configured to invert the first inverted voltage in response to a hold signal and an inverted hold signal and output a third inverted voltage to the first node.

13. The program circuit of claim 11, wherein the first latch unit comprises:
a first inverter configured to invert the voltage of the first node and output a first inverted voltage;
a second inverter configured to invert the first inverted voltage and output a second inverted voltage to the second node, the second inverter having a sufficiently high drivability to shift the voltage of the second node that is latched by the second latch unit; and
at least one n-type metal oxide semiconductor (NMOS) transistor connected between the first node and the first power supply voltage, and having a gate to which the first inverted voltage is applied.

14. The program circuit of claim 11, wherein the second latch unit comprises:
a first p-type metal oxide semiconductor (PMOS) transistor connected between a second power supply voltage and the second node and having a gate to which the power stabilization signal is applied;
a second PMOS transistor connected in parallel to the first PMOS transistor and having a gate connected to the output node;
a first n-type metal oxide semiconductor (NMOS) transistor having a first terminal connected to the second node and a gate to which the power stabilization signal is applied; and
a second NMOS transistor connected between a second terminal of the first NMOS transistor and the first power supply voltage, and having a gate connected to the output node.

15. The program circuit of claim 14, wherein a program state of the antifuse is determined by the output signal.

16. A semiconductor device, comprising:
a substrate of a first conductivity type;
a source and drain of a second conductivity type disposed apart from each other in a region of the substrate;
a gate on the substrate between the source and drain;
a dielectric layer between the gate and substrate; and
a control circuit configured to apply a first program voltage to the substrate, a second program voltage to the gate and drain, and a first power supply voltage to the source, such that the dielectric layer ruptures.

17. The semiconductor device of claim 16, wherein the first program voltage is one of a channel initiated secondary electron (CHISEL) programming voltage and a channel initiated secondary hole (CHISHL) programming voltage,
the second program voltage is an impact ionization programming voltage, and
the dielectric layer is configured to rupture at a region adjacent to the drain.

18. The semiconductor device of claim 17, wherein the source, drain, gate and dielectric layer are part of a transistor.

19. The semiconductor device of claim 17, wherein the semiconductor device is a programmable logic device.

* * * * *